United States Patent [19]
Cho

[11] Patent Number: 5,610,091
[45] Date of Patent: Mar. 11, 1997

[54] METHOD FOR MANUFACTURING A NON-VOLATILE MEMORY CELL

[75] Inventor: Byung J. Cho, Kyungki-do, Rep. of Korea

[73] Assignee: Hyundai Electronics Industries Co., Ltd., Kyungki-do, Rep. of Korea

[21] Appl. No.: 525,149

[22] Filed: Sep. 8, 1995

[30] Foreign Application Priority Data

Sep. 8, 1994 [KR] Rep. of Korea ............... 94-22564

[51] Int. Cl.$^6$ ............................................. H01L 21/265
[52] U.S. Cl. .............................. 437/43; 437/52; 437/203
[58] Field of Search ............................. 437/43, 52, 45, 437/203

[56] References Cited

U.S. PATENT DOCUMENTS 5,376,572  12/1994  Yang et al. ............................. 437/43

FOREIGN PATENT DOCUMENTS 4-111470  4/1992  Japan .

*Primary Examiner*—Jey Tsai
*Attorney, Agent, or Firm*—Fish & Richardson P.C.

[57] ABSTRACT

A method for manufacturing a non-volatile memory cell which can improve the reliability and electrical operation characteristics of a memory cell by making a recess structure of a silicon substrate of a channel region in order to increase capacitance coupling ratio between a control gate and a floating gate is disclosed.

3 Claims, 3 Drawing Sheets

METHOD FOR MANUFACTURING A NON-VOLATILE MEMORY CELL

FIELD OF THE INVENTION

This invention relates to a method for manufacturing a non-volatile memory cell, and more particularly to a method for manufacturing a non-volatile memory cell having a stack gate electrode.

INFORMATION DISCLOSURE STATEMENT

Generally, a non-volatile memory device such as a flash EEPROM has a stack gate electrode, a source region and a drain region, with the stack gate electrode being formed with a tunnel oxide layer, a floating gate, a dielectric layer and a control gate. The non-volatile memory device has a program and erasure function. A voltage higher than 12 volts is supplied to the control gate to carry out the program or erasure operation of the non-volatile memory device, thereby forming a strong electric field around the tunnel oxide layer. At this time, electrical phenomena such as a field inversion and a punch-through may occur in a periphery circuit region caused by the high voltage. In the memory device fabrication process, two kind of methods are used to prevent the field inversion and the punch-through phenomena. The first method is to increase the thickness of the field oxide layer or the space between burried $N^+$ layers. The second method is to increase the capacitance coupling ratio between the control gate and the floating gate. However, since the first method increases the size of the memory cell, the degree of integration of the memory device is decreased. Furthermore the second method increases the area of the gate electrode and decreases a thickness of the dielectric layer. Accordingly, both the size and the reliability of the memory cell is increased.

Recently, another method increasing the reliability of memory devices is used in semiconductor device fabrication. The method is to form a spacer on the side wall of the stack gate electrode. The spacer is formed with a CVD-(Chemical Vapor Deposition) oxide layer or a layer stacked with a CVD oxide, a nitride and an oxide. But in this case, a spacer induced degradation phenomenon may easily occur by the program operation using a injection of hot electron. And a leakage of electric charge passing a corner of the gate electrode occurs, whereby charge retention capability of the memory cell is reduced.

Therefore, it is an object of the present invention to provide a method for manufacturing a non-volatile memory cell which can increase data retention time.

Another object of the present invention is to provide a method for manufacturing a non-volatile memory cell which can increase the overlap area of a floating gate and a control gate by making a recess structure of a silicon substrate of a channel region.

To achieve the above objects, a method for manufacturing a non-volatile memory cell, comprises the steps of: sequentially forming a pad oxide layer and a nitride layer on a silicon substrate having a field oxide layer; patterning said nitride layer so as to expose a selected portion of said pad oxide layer; forming a cell oxidation layer by oxidizing the selected portion of said pad oxide layer; etching an exposed portion of said cell oxidation layer, thereby forming a recess; forming a tunnel oxide layer on said silicon substrate exposed by etching said cell oxidation layer; sequentially forming a first conductive layer, a dielectric layer and a second conductive layer on the resulting structure after forming said tunnel oxide layer; forming a stacked gate electrode by sequentially patterning said second conductive layer, said dielectric layer and said first conductive layer; and forming source and drain regions by injecting an impurity in said silicon substrate and then annealing said silicon substrate.

BRIEF DESCRIPTION OF THE DRAWINGS

To better understand the nature and objective of the invention, reference should be made to the following detailed descriptions of the accompanying drawings in which.

Similar reference characters refer to similar parts through the several views of the drawings.

DETAILED DESCRIPTION OF THE INVENTION

FIGS. 1A through 1G are sectional views explaining a method for manufacturing a non-volatile memory cell.

Figure 1A:
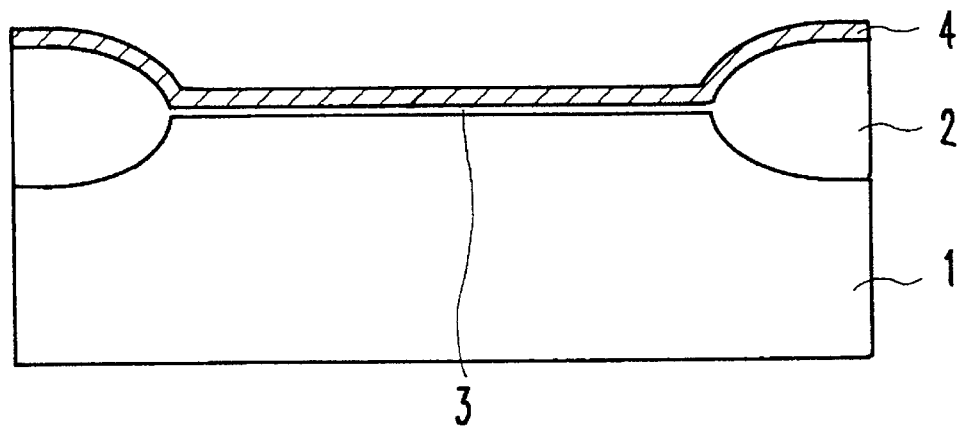
FIGS. 1A through 1G are sectional views explaining a method for manufacturing a non-volatile memory cell according to the present invention.

Referring to FIG. 1A, a pad oxide layer 3 is formed on a silicon substrate 1 having a field oxide layer 2 with a thickness of 50 to 100 Å by a thermal oxidation process,and a nitride layer 4 is then formed, with a thickness of 500 to 1000 Å on the pad oxide layer 3.

Figure 1B:
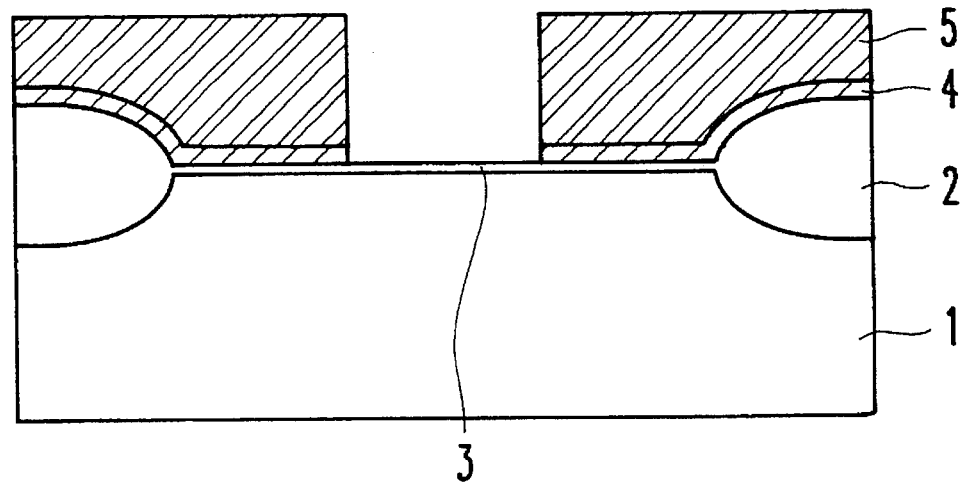

Referring to FIG. 1B, a photoresist is coated on the nitride layer 4 and the photoresist is then patterned, thereby forming a photoresist pattern 5. An exposed portion of the nitride layer 4 is etched to exposed a portion of the pad oxide layer 3.

Figure 1C:
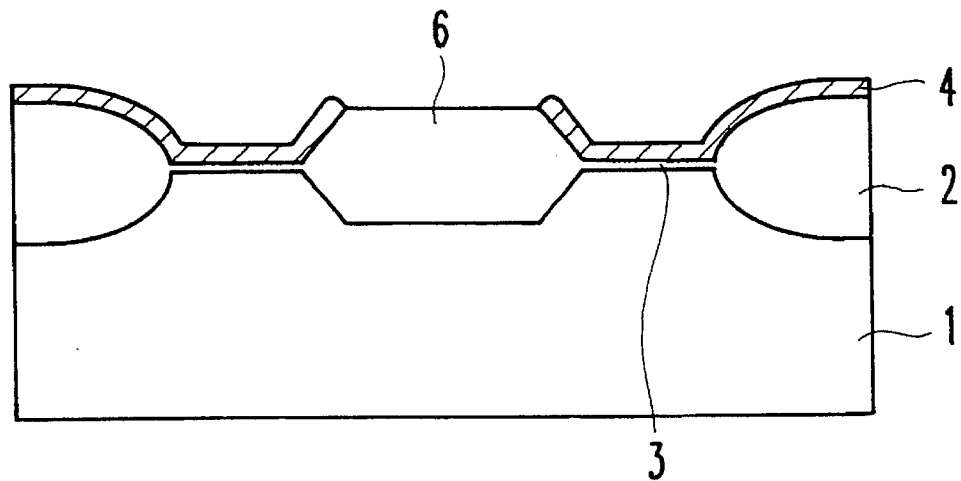

Referring to FIG. 1C, the photoresist pattern 5 is removed and the pad oxide layer 2 exposed by etching an exposed portion of the nitride layer 4 is then grown by a thermal oxidation process using the residual nitride layer 4 as an oxidation barrier, whereby a cell oxidation layer 6 is formed with a thickness of 2500 to 3500 Å.

Figure 1D:
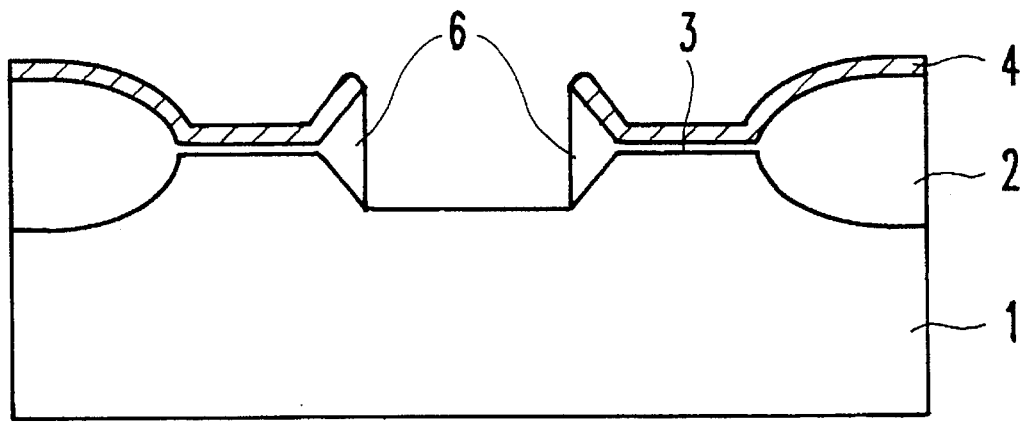

Referring to FIG. 1D, an exposed portion of the cell oxidation layer 6 is etched by an etching process using the residual nitride layer 4 as an etch barrier, thereby forming a recess at the center portion of the silicon substrate 1 leaving an unexposed portion of the cell oxidation layer 6. It is desirable to etch the exposed portion of the cell oxidation layer 6 by a dry etching process. However, in order to protect the silicon substrate 1 from damage, the cell oxidation layer 6 is first etched by the dry etching process until the thickness thereof is 200 to 300 Å and the residual is etched by a wet etching process.

Figure 1E:
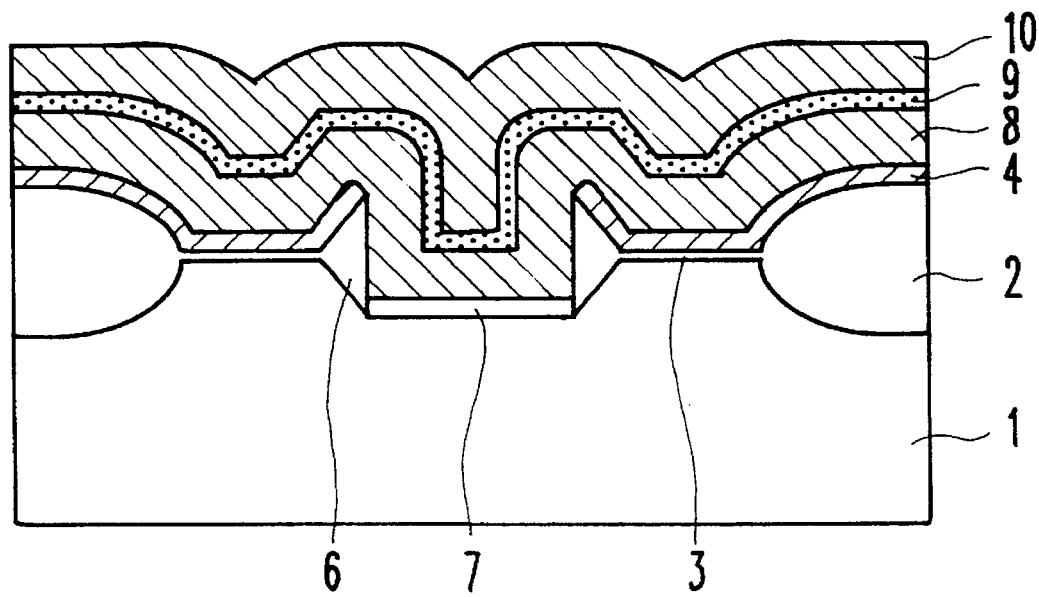

Referring to FIG. 1E, a tunnel oxide layer 7 is formed on the silicon substrate 1, exposed by etching the cell oxidation layer 6 with the thickness of 80 to 120 Å and a first conductive layer 8, a dielectric layer 9 and a second conductive layer 10 are then sequentially formed on the resulting structure after forming the tunnel oxide layer 7. Each of the first and second conductive layers 8 and 10 is formed by depositing a polysilicon and injecting an impurity ion such as a $POCl_3$ in the polysilicon. It is desirable to form the first conductive layer 8 with one-third (⅓) of the thickness of the cell oxidation layer 6, that is, 800 to 1200 Å.

Figure 1F:
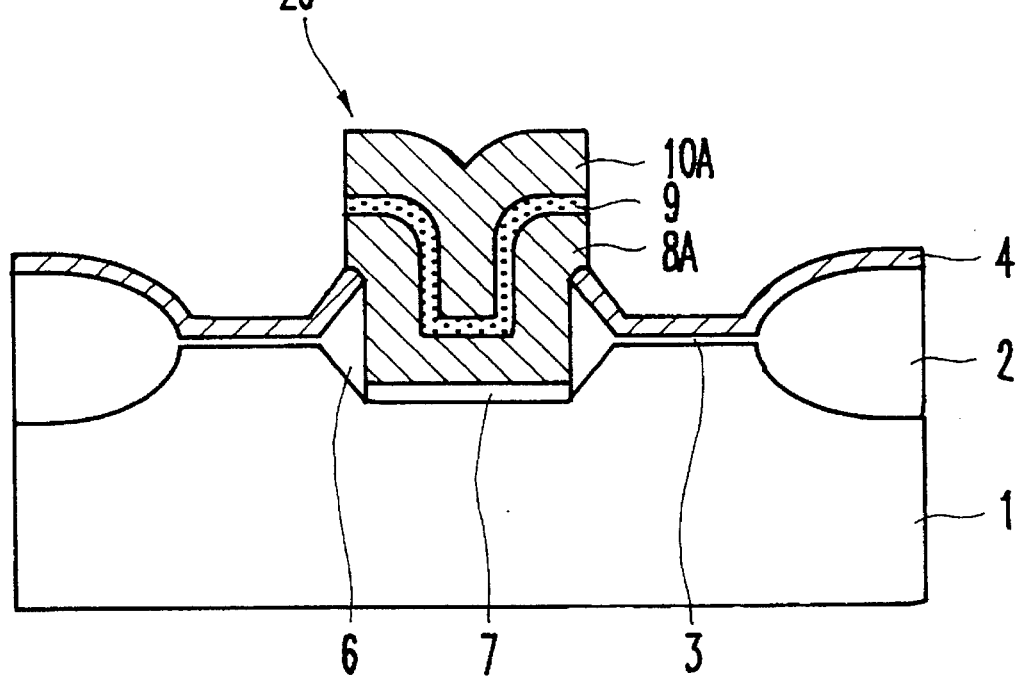

Referring to FIG. 1F, the second conductive layer 10, the dielectric layer 9 and the first conductive layer 8 are sequentially patterned by a photo lithography process using a mask for a gate electrode, thereby forming a stacked gate electrode 20 having a tunnel oxide layer 7, a floating gate 8A, a dielectric layer 9 and a control gate 10A. The stacked gate electrode is formed at the recess.

Figure 1G:
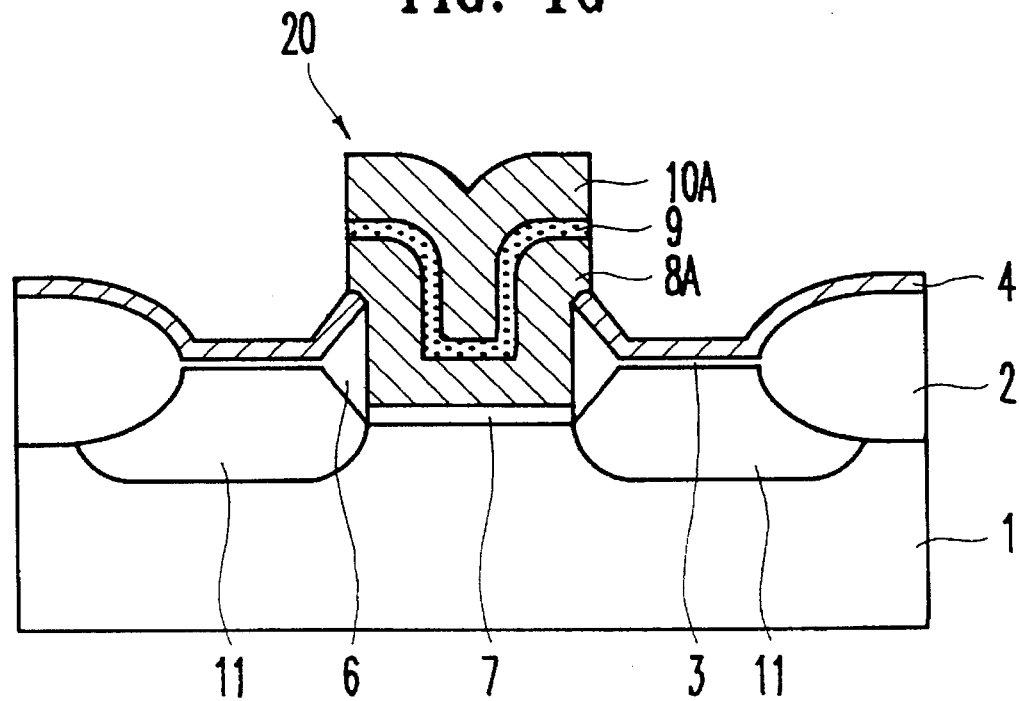

Referring to FIG. 1G, an impurity ion such as arsenic is injected in the silicon substrate 1 and the annealing process is then performed, thereby forming a source and drain region 11.

As described above, according to the present invention, the surface area of the floating gate is increased, thereby increasing the capacitance between the floating gate and control gate. Furthermore, although low voltage is applied to the control gate, a program or erasure operation may effectively proceed. Also, the likelihood of occurrence of a field inversion and a punch-through is decreased. A spacer induced is not occurred since the floating gate is surrounded by a thermal oxide layer instead of a CVD oxide layer. Accordingly, reliability of a non-volatile memory device is improved and loss of electric charge is reduced, thereby increasing data retention time.

Although this invention has been described in its preferred embodiment with a certain degree of particularity, one skilled in the art would know that the preferred embodiment disclosed here is only an example and that the construction, combination and arrangement of its the spirit and the scope of the invention.

What is claimed is:

1. A method for manufacturing a non-volatile memory cell, comprising the steps of:

sequentially forming a pad oxide layer and a nitride layer on a silicon substrate having a field oxide layer;

patterning said nitride layer so as to expose a selected portion of said pad oxide layer;

forming a cell oxidation layer by oxidizing the selection portion of said pad oxide layer;

etching an exposed portion of said cell oxidation layer by an etching process using said patterned nitride layer as an etch barrier, thereby forming a recess in said silicon substrate and leaving an unexposed portion of said cell oxidation layer;

forming a tunnel oxide layer on said silicon substrate exposed by etching said cell oxidation layer;

sequentially forming a first conductive layer, a dielectric layer and a second conductive layer on the resulting structure after forming said tunnel oxide layer;

forming a stacked gate electrode at the recess by sequentially patterning said second conductive layer, said dielectric layer and said first conductive layer, and forming source and drain regions by injecting an impurity into said silicon substrate and then annealing said silicon substrate.

2. The method of claim 1, wherein said cell oxidation layer is, first etched by a dry etching process until the thickness of said cell oxidation layer is 200 to 300 Å and the residual is then etched by a wet etching process.

3. The method of claim 1, wherein said cell oxidation layer is etched by a dry etching process.

* * * * *